United States Patent
Lee et al.

(10) Patent No.: US 10,546,745 B2
(45) Date of Patent: Jan. 28, 2020

(54) SEMICONDUCTOR PROCESSING METHOD

(71) Applicant: International Business Machines Corporation, Armonk, NY (US)

(72) Inventors: Yun Seog Lee, Seoul (KR); Joel Pereira de Souza, Putam Valley, NY (US); Devendra K. Sadana, Pleasantville, NY (US); Marinus Hopstaken, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 15/844,905

(22) Filed: Dec. 18, 2017

(65) Prior Publication Data
US 2019/0189434 A1    Jun. 20, 2019

(51) Int. Cl.
*H01L 21/02*    (2006.01)
*H01L 21/311*   (2006.01)

(52) U.S. Cl.
CPC ...... *H01L 21/02205* (2013.01); *H01L 21/022* (2013.01); *H01L 21/0226* (2013.01); *H01L 21/02164* (2013.01); *H01L 21/02178* (2013.01); *H01L 21/02181* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 2014/0027884 A1* | 1/2014 | Tang | H01L 23/293 257/632 |
| 2015/0318431 A1* | 11/2015 | Aranami | H01L 31/046 438/93 |

* cited by examiner

*Primary Examiner* — Bradley Smith
(74) *Attorney, Agent, or Firm* — Scully, Scott, Murphy & Presser, P.C.; L. Jeffrey Kelly, Esq.

(57) ABSTRACT

A method of processing semiconductor material includes applying an organosulfur solution to a top surface of a semiconductor material, the organosulfur solution having at least one organosulfur compound. The at least one organosulfur compound has at least one sulfur atom double bonded to a carbon atom and a pH of not less than 8. An organosulfur solution may be applied at temperatures above 25° C. to increase sulfur deposition rates and increase sulfur coverage on a surface of a semiconductor material.

17 Claims, 2 Drawing Sheets

SEMICONDUCTOR PROCESSING METHOD

BACKGROUND

The present application relates to methods of manufacturing semiconductor devices, such as, for example, transistors, in III-V semiconductor substrates. Further aspects of the present application relate to surface passivation of semiconductor substrates and to sulfur-doping of III-V semiconductor substrates with nanoscale dimensional control.

Passivation of semiconductor materials during a manufacturing process may allow greater control over electrical properties of an integrated circuit generated by the manufacturing process. Passivation allows a manufacturer to protect surfaces of a semiconductor material or a semiconductor film stack to avoid the formation of oxides or to prevent the adhesion of contaminants to a semiconductor stack or material. Some passivation may protect semiconductor materials such as an intrinsic semiconductor (e.g., silicon) or compound semiconductors (e.g., III-V semiconductors such as, for example, GaAs) from reacting with atmospheric oxygen to form a native oxide layer on the top/exposed surface of the material. Native oxide layers may be removed from a semiconductor material with additional processing steps with concomitant increases in contaminants and/or defects. Undetected native oxide may modify an electrical characteristic of an integrated circuit, such as increasing contact resistance, reducing clock speed, or decreasing $I_{on}$ for a transistor in an integrated circuit.

Semiconductor materials may be passivated by exposure of the semiconductor material to a sulfur source, wherein the sulfur interacts with the top/exposed surface of the semiconductor material to form a protective sulfur layer on the top/exposed surface of the semiconductor material. Sulfur deposition may be performed by applying a solution of ammonium sulfide $(NH_4)_2S$ to the semiconductor material. However, use of ammonium sulfide has significant drawbacks. For example, at temperatures over 15° C., ammonium sulfide decomposes into ammonia and hydrogen sulfide, which are toxic to breathe or ingest. Manufacturing with ammonium sulfide uses costly exhaust systems to protect employees and facilities from exposure to toxic decomposition byproducts, and incurs higher waste disposal costs. Further, because ammonium sulfide solutions must be maintained at low temperatures to avoid decomposition into hydrogen sulfide, ammonium sulfide processing exhibits low rates of surface sulfurization (low rates of surface coverage, and thin sulfur film formation). Improvement to semiconductor passivation with sulfur (sulfurization) can improve protection against native oxide formation.

Doping of semiconductor materials to modify conductivity of a semiconductor material, or to modify a band gap of a semiconductor material, may be performed by implanting dopants into the semiconductor material. Implanting may involve accelerating a dopant atom to a high velocity and directing the accelerated dopant atom into a semiconductor material. An accelerated dopant atom may penetrate to a depth below the surface of the semiconductor material according to the mass of the dopant and the acceleration applied to the dopant atom before the dopant atom strikes the semiconductor surface. The penetration of the implanted dopant atoms may disrupt the crystal lattice of the semiconductor material, which disruption may be healed by an annealing operation performed after implanting of dopant atoms. Implantation into intrinsic semiconductor (e.g., silicon) and annealing of implanted intrinsic semiconductor may restore crystal structure to near-original condition. However, compound semiconductors such as III-V semiconductors may undergo irreparable damage following implanting and annealing. Localized stoichiometry may be disrupted after implant and annealing, resulting in small regions with deviations from the average stoichiometry of the bulk semiconductor material. Such deviations may result in lowered dopant activation, or higher junction leakage or leakage currents.

Sulfur may be used as a dopant for III-V semiconductors because sulfur atoms may be thermally diffused into III-V semiconductors without disrupting the crystal lattice, and without interrupting the uniform distribution of group III and group V atoms within the semiconductor material. Dimensions of a junction formed by thermal diffusion of sulfur may be regulated according to the annealing conditions used to thermally diffuse sulfur atoms into the semiconductor material. Sulfur-doping of III-V semiconductor substrates with nanoscale dimensional control may be improved with improvement in control and coverage amounts of sulfur on a semiconductor material.

SUMMARY

Aspects of the present application relate to a method of processing a semiconductor material which may include applying an organosulfur solution to a top surface of the semiconductor material. Some aspects of the present application relate to an organosulfur solution having at least one organosulfur compound with at least one sulfur atom double bonded to a carbon atom, and a pH of not less than 8.

DETAILED DESCRIPTION

Figure 1:
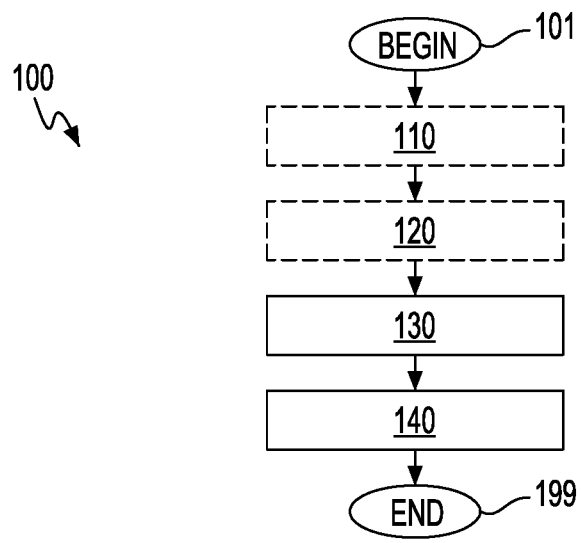
FIG. 1 is a flowchart of a method of passivating a semiconductor surface, according to some embodiments of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Sulfur deposition onto a semiconductor material, whether an intrinsic semiconductor (e.g., silicon) or a compound semiconductor (e.g., SiGe, or a III-V semiconductor, such as GaAs), may be improved over traditional ammonium sulfide [$(NH_4)_2S$] by using solutions containing an organosulfur compound, such as a thiourea compound, in a strong base. In some embodiments, a compound semiconductor may be doped to include a third semiconductor material, such as GaAs being doped with indium to produce the compound semiconductor material InGaAs. Other embodiments of organo-doped compound semiconductor materials are also envisioned in the present disclosure. Thiourea compounds have the general chemical formula $(R_1R_2N)(R_3R_4N)C=S$, where a sulfur atom is double-bonded to a central carbon atom, and the central carbon is singly-bonded to two nitrogen atoms, where each nitrogen atom has two substituents: the first nitrogen has substituents $R_1$ and $R_2$, and the second nitrogen has two substituents $R_3$ and $R_4$. The thiourea substituents $R_1$—$R_4$ may be hydrogen, or aliphatic substituents. An aliphatic substituents may be a saturated alkane such as a methyl group, an ethyl group, a propyl group, or an isopropyl group (i.e., 1—methyl—ethane), although other aliphatic substituents, both saturated and unsaturated, are also envisioned in the present application. Other kinds of organosulfur compounds that may serve as sulfur sources for sulfur-based passivation or doping of semiconductor materials may also include thioamides $(R_1R_2N)(R_3)C=S$ or other organosulfur compounds where a sulfur atom is double bonded to a carbon atom. The thioamide substituents $R_1$—$R_3$ may be hydrogen, or aliphatic substituents as described above with regard to thiourea compound substituents. Aliphatic substituents for thioamides may include saturated alkanes such as a methyl group, an ethyl group, a propyl group, or an isopropyl group (i.e., 1—methyl—ethane), although other aliphatic substituents are also envisioned. In some embodiments of the present application, an organosulfur compound has a plurality of sulfur atoms double bonded to carbon atoms.

An organosulfur compound may undergo a chemical reaction in strongly basic solution (e.g., a solution having a pH of at least 8) in order to liberate a double-bonded sulfur to form a sulfide $S^{2-}$ ion in solution. For example, thiourea $(NH_2)(NH_2)C=S$ reacts with strong base (e.g., a group I base such as NaOH or KOH, or a group II base such as $Mg(OH)_2$, or an inorganic base such as ammonium hydroxide or TMAH (tetramethylammoniumhydroxide), to produce sulfide ion in solution. Other bases may be used to form sulfide ion in solution, so long as the base is capable of deprotonation of the organosulfur molecule to release sulfide ion, or capable of electrophilic substitution-type interactions with the carbonyl carbon to release sulfide ion from the organosulfur molecule. A base may be sufficiently strong to form sulfide ion when the base can deprotonate an organosulfur compound and trigger or promote sulfur liberation from the organosulfur molecule. A base may also promote sulfur liberation from organosulfur molecules when the base can react with a carbon atom that is double bonded to a sulfur atom, promoting formation of, e.g., a C—O single bond, and resulting in a C=S double bond becoming a C—S single bond.

Sulfide ion may form weak chemical bonds with other sulfur atoms, and adhere to semiconductor materials using Wan der Waals forces, to form protective films of sulfur on semiconductor materials. A rate of sulfurization/sulfur deposition of a semiconductor material may increase by increasing the temperature of the organosulfur solution. A thickness of a sulfur film on the semiconductor material may be increased by extending the time a sulfurization solution is maintained on an exposes surface of a semiconductor material, and by increasing the temperature of the solution to increase chemical reaction rates.

A concentration of organosulfur compound in an organosulfur solution may be to saturation, or may be less than saturation, and still perform a sulfurization process on an exposed surface of semiconductor material. Ammonium sulfide, in solid or in solutions, can decompose (i.e., form hydrogen sulfide) at temperatures above 15° C. Organosulfur compounds, or solutions thereof, do not undergo decomposition like ammonium sulfide. An organosulfur solution may be an aqueous solution, an alcohol-based solution, or have a mixture of water and an alcohol, containing organosulfur molecules. Organosulfur compounds may be applied to a semiconductor substrate at temperatures ranging from just above the freezing point of a solvent for an organosulfur solution (e.g., 0° C. for water, or below 0° C. for simple alcohols such as methanol or ethanol, up to almost the boiling point of a solvent (64° C. for methanol, 78° C. for ethanol, or 100° C. for water), without decomposition.

An organosulfur solution may generate a passivating layer of sulfur atoms on a semiconductor material such as a III-V semiconductor, to protect the semiconductor from contamination or native oxide formation. FIG. 1 is a flow diagram depicting operations in a method 100 of treating semiconductor materials, according to some embodiments of the present application. The method begins in operation 101. Method 100 includes an optional cleaning operation 110, wherein a top surface of a semiconductor substrate is treated to remove particles and/or residues form the top surface. Particles and residues may interfere with subsequent processing steps, including film deposition, patterning, and/or etching. Method 100 also includes an optional masking operation 120, wherein a mask is formed on the top surface of the semiconductor substrate. A mask may be formed by depositing a mask layer on atop surface of the semiconductor substrate, and the mask layer may be patterned using photolithography techniques. In some embodiments, a mask layer may be a layer of photoresist and a pattern in the mask layer may be formed by exposing the layer of photoresist with patterned light or radiation, and a portion of the layer photoresist removed by developing the layer of photoresist in a solvent. Method 100 may include an etching operation 130, wherein a native oxide on the top surface of the semiconductor material may be removed from an exposed portion of the top surface of the semiconductor material. (See FIG. 3A, having a native oxide (element 306), and 3B, wherein native oxide has been removed form a top surface of a semiconductor material (element 304).) Native oxide may be removed from a semiconductor material by etching using an aqueous etching solution such as hydrofluoric acid (HF), or by a plasma etching process, using a gas mixture such as argon and HF. Method 100 may further include a sulfur-deposition operation (or, a passivation operation) 140, wherein an organosulfur solution is applied to the top surface of the semiconductor material. According to some embodiments of the present application, the organosulfur solution may be heated, prior to application, to a temperature between 15° C. and 90° C., although greater and lesser temperatures may also be used. An organosulfur solution may include a thiourea compound or a thioamide compound, or a mixture thereof, according to some embodiments of the present application. Some embodiments of the present application may apply a plurality of organosulfur solutions to a top surface of the semiconductor material. In some embodiments of the present application, the semiconductor material may be rinsed between applications of organosulfur solutions to the semiconductor material. The method 100 ends with operation 199.

Figure 2:
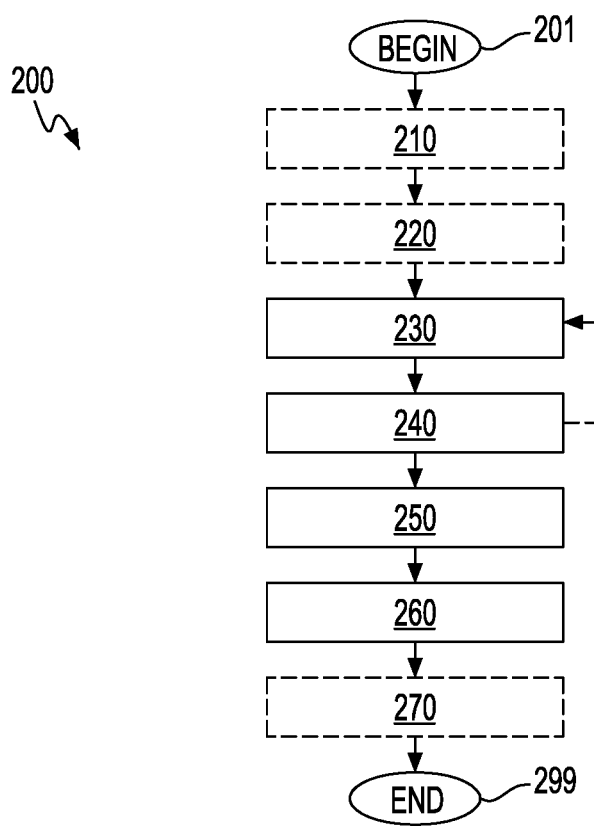
FIG. 2 is a flowchart of a method of doping a semiconductor material with sulfur, according to some embodiments of the present application.

An organosulfur solution may be used to deposit a sulfur layer (see FIG. 3C, element 322) that can form ultrathin junctions of a semiconductor device source and drain regions, according to some embodiments of the present application. FIG. 2 is a flow diagram depicting operations in a method 200 of treating semiconductor materials, according to some embodiments of the present application. Method 200 begins with operation 201. Method 200 contains operations 210, 220, 230, and 240 that are be analogous to operations 110, 120, 130, and 140, respectively, of method 100. In some embodiments of the present application, operation 230 (applying a mask layer) may be repeated following a first performance of operation 240 (forming a sulfur layer), and operation 240 may be repeated a second time following the second performance of operation 230. Thus, by applying a first organosulfur solution and a second organosulfur solution, a thickness of the sulfur layer may be increased. By so doing, a sulfur layer may be formed with a first thickness in the area that was exposed during the first performance of operation 240, and subsequently masked by the second performance of operation 230, while the sulfur may have a second thickness in the area that was exposed (i.e., not masked) during both the first and second performances of operation 240.

Method 200 includes operation 250, wherein a cap layer is deposited onto a sulfur layer formed during sulfur-deposition operation 240. A cap layer may serve to trap sulfur below the cap layer and against the top surface of the semiconductor material. In areas where a mask layer may be deposited, a cap layer may trap the deposited sulfur below the cap layer and against a top surface of the mask layer material. A cap layer may include one or more dielectric layers. When a single dielectric material is used as the dielectric layer/cap layer, the dielectric material may include one of silicon dioxide ($SiO_2$), TEOS, spin-on glass, silicon nitride, silicon oxy-nitride, aluminum oxide ($Al_2O_3$), or hafnium dioxide ($HfO_2$). When a plurality of dielectric layers are deposited to form the cap layer, the plurality of layers may include two or more of silicon dioxide ($SiO_2$), TEOS, spin-on glass, silicon nitride, silicon oxy-nitride, aluminum oxide ($Al_2O_3$), or hafnium dioxide ($HfO_2$), or some other inorganic oxide or metal oxide. In embodiments of the cap layer having a plurality of dielectric layers, each dielectric layer has an individual dielectric material thickness, which individual thickness may be the same as, or different from, the thickness of another dielectric layer in the cap layer. According to some embodiments of the present application, the cap layer may have a thickness raging from 5 nm to 20 nm, although greater and lesser cap layer thicknesses are also envisioned.

Method 200 includes an anneal operation 260, wherein the semiconductor stack, including the semiconductor material, the sulfur layer, and the cap layer, are annealed in order to drive the atoms of the sulfur layer (formed during operation 240) into the lattice of the semiconductor. Anneal operation 260 may include heating the semiconductor stack to temperatures ranging from 250° C. to 400° C., although anneal temperatures greater and lesser than the recited range are also envisioned in the present application. Anneal operation 260 may also include heating the semiconductor stack for an anneal time ranging from 20 minutes to 40 minutes, although times greater than and lesser than the recited range are also envisioned by the present application. In some embodiments of the present application, an anneal operation may be performed by heating a semiconductor stack to an anneal temperature of 250° C. for an anneal period of 20 minutes, although anneal times greater than 20 minutes are also envisioned. In some embodiments of the present application, an anneal operation may be performed by heating a semiconductor stack to an anneal temperature of 400° C. for an anneal period of 30 minutes, although anneal periods longer or shorter than 30 minutes are also envisioned. Annealing may take place in an RTP (rapid thermal annealing) furnace, or by laser annealing, or by some other process of heating the wafer near the exposed portion of the top surface of the semiconductor material to drive the atoms of the sulfur layer (formed during operation 240) into the lattice of the semiconductor. Rapid annealing may take place with material heating up to 700° C. if the anneal period is in the millisecond range. Sulfur diffuses into the surface region of the semiconductor material, especially III-V semiconductor materials, upon thermal stimulation, whether of short duration (e.g., milliseconds (ms) to seconds (s) range, as with laser annealing) or long duration (e.g., greater than 1 second, as with RTP annealing) thermal stimulation. Method 200 includes a removing operation 270, wherein the top surface of the semiconductor material is exposed after annealing has taken place. Removing operation 270 may include a plasma etching step, and/or an aqueous etching step, or other surface removal processes configured to remove materials above the top surface of the semiconductor material in preparation for deposition of subsequent layers of an semiconductor device, such as gate dielectric materials, interlayer dielectric (ILD) materials, spacer materials, and/or further semiconductor materials. In some embodiments, removal operation 270 includes multiple etching and/or removing steps to expose the top surface of the semiconductor material. In some embodiments of the present application, some parts of the removal operation are blanket (i.e., unselective) removal steps, and some parts of the removal operation selectively remove certain materials while preserving other materials present on the surface of the semiconductor material.

Figure 3A:
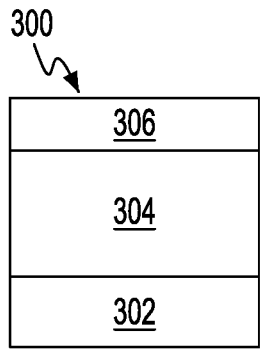
FIGS. 3A-3F are cross-sectional diagrams of a semiconductor device at stages of a manufacturing process, according to some embodiments of the present application.
Figure 3B:
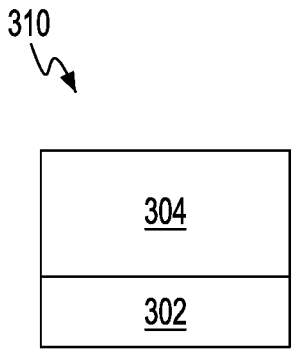
Figure 3C:
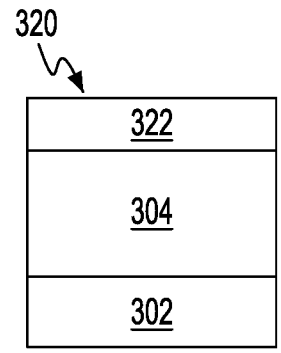

FIGS. 3A-3F depict cross-sectional diagrams of semiconductor devices at several stages of a manufacturing process for making integrated circuits, according to some embodiments of the present application. FIG. 3A depicts a first device 300 at a first stage of a manufacturing process similar to method 200. First device includes a substrate 302 with a semiconductor material 304 deposited thereon. A native oxide 306 is against a top surface of the semiconductor material 304. FIG. 3B depicts a second device 310 at a second stage of a manufacturing process similar to method 200, following performance of an etching operation to remove a native oxide such as layer 306, from the top of the semiconductor material. FIG. 3C depicts a third device 320 at a third stage of a manufacturing process, after a sulfur layer 322 has been grown on the top surface of semiconductor material 304, such as after operation 240 of method 200. According to embodiments of the present application, sulfur layer 322 may be grown from a basic organosulfur solution containing a thiourea compound, thioamide compound, or another sulfur-containing compound wherein at least one sulfur atom is double-bonded to a carbon atom.

Figure 3D:
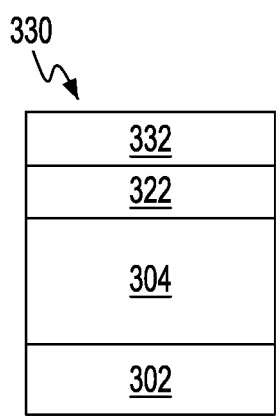
Figure 3E:
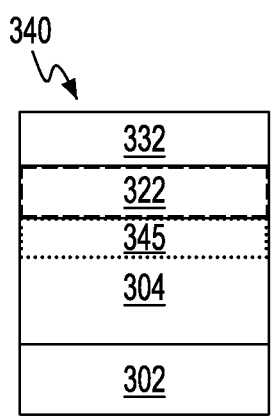
Figure 3F:
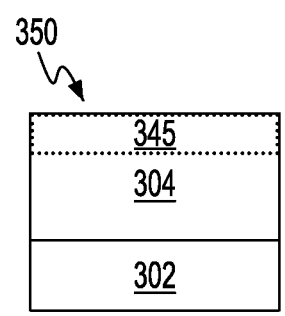

FIG. 3D depicts a fourth device 330 following deposition of a cap layer 332 over sulfur layer 322. Cap layer 332 may be a dielectric material, such as silicon dioxide ($SiO_2$), silicon nitride, or silicon oxy-nitride, or a metal oxide such as aluminum oxide ($Al_2O_3$), hafnium dioxide ($HfO_2$), or some other metal oxide, configured to completely cover sulfur layer 322 during an annealing operation. FIG. 3E depicts a fifth device 340 following performance of an annealing operation, such as operation 260. A portion of sulfur layer 322 has been incorporated into the layer of semiconductor material 304 to form a junction region 345 at an interface between sulfur layer 322 and the layer of semiconductor material 304. Junction region 345 may have a thickness ranging from 2 nm to 10 nm, although thicknesses smaller or greater than this range are also envisioned by the present application. In a preferred embodiment, the thin junction may extend to a depth of 5 nm below the top surface of the doped semiconductor material. FIG. 3F depicts a sixth device 350 following a removing operation such as operation 270, wherein cap layer 332 and sulfur layer 322 have been removed from the top surface of semiconductor material 304 (e.g., from the top of junction region 345). A cap layer may be removed by chemical etching, or by plasma etching processes, according to embodiments of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of processing a semiconductor material, the method comprising:
    applying a first organosulfur solution to a top surface of the semiconductor material, the organosulfur solution having at least one organosulfur compound wherein at least one sulfur atom is double bonded to a carbon atom, the organosulfur solution having a pH of not less than 8;
    depositing a cap layer onto the semiconductor material after applying the first organosulfur solution; and
    performing an annealing operation to diffuse sulfur located between the cap layer and the semiconductor material into the semiconductor material, wherein the annealing operation is performed at a temperature of at least 250° C. for at least 20 minutes.

2. The method of claim 1, further comprising cleaning the top surface of the semiconductor material prior to applying the first organosulfur solution to the top surface of the semiconductor material.

3. The method of claim 1, further comprising removing a native oxide from the top surface of the semiconductor material prior to applying the first organosulfur solution to the top surface of the semiconductor material.

4. The method of claim 1, wherein the semiconductor material comprises either a III-V compound or a Si—Ge semiconductor material.

5. The method of claim 4, wherein the semiconductor material comprises at least indium gallium arsenide (InGaAs).

6. The method of claim 1, wherein the cap layer comprises a dielectric material.

7. The method of claim 1, wherein the cap layer comprises a metal oxide.

8. The method of claim 1, wherein depositing the cap layer further comprises depositing a plurality of dielectric layers, the plurality of dielectric layers comprising at least two of aluminum oxide ($Al_2O_3$), hafnium dioxide ($HfO_2$), and silicon dioxide ($SiO_2$).

9. The method of claim 1, further comprising removing the cap layer from the semiconductor material.

10. The method of claim 9, wherein removing the cap layer from the semiconductor material further comprises performing an etching operation.

11. The method of claim 9, wherein removing the cap layer from the semiconductor material further comprises performing a chemical etching operation.

12. The method of claim 1, wherein the organosulfur solution contains a thiourea compound $(R_1R_2N)(R_3R_4N)C{=}S$ wherein each of $R_1$-$R_4$ is selected from the group consisting of hydrogen and a saturated alkane.

13. The method of claim 12, wherein each of $R_1$-$R_4$ is hydrogen.

14. The method of claim 1, wherein the organosulfur solution contains a thioamide compound $(R_1R_2N)(R_3)C{=}S$, wherein $R_1$ and $R_2$ are selected from the group consisting of hydrogen and saturated alkanes, and wherein $R_1$ is an aliphatic substituent.

15. The method of claim 14, wherein the thioamide compound substituents $R_1$-$R_3$ are as follows: $R_1$=hydrogen, and $R_2$=hydrogen, and $R_3$=a methyl group.

16. The method of claim 1, further comprising applying a second organosulfur solution to the top surface of the semiconductor material, wherein the second organosulfur solution is applied after the first organosulfur solution.

17. A method of processing a semiconductor material, the method comprising:
    applying a first organosulfur solution to a top surface of the semiconductor material, the organosulfur solution having at least one organosulfur compound wherein at least one sulfur atom is double bonded to a carbon atom, the organosulfur solution having a pH of not less than 8;
    depositing a cap layer onto the semiconductor material after applying the first organosulfur solution;
    performing an annealing operation to diffuse sulfur located between the cap layer and the semiconductor material into the semiconductor material; and
    removing the cap layer from the semiconductor material.

* * * * *